(12) United States Patent
Cheng et al.

(10) Patent No.: US 8,222,733 B2
(45) Date of Patent: Jul. 17, 2012

(54) SEMICONDUCTOR DEVICE PACKAGE

(75) Inventors: Ming-Hsiang Cheng, Kaohsiung (TW);
Yi-Shao Lai, Yonghe (TW);
Tsung-Yueh Tsai, Kaohsiung (TW);
Hsiao-Chuan Chang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 155 days.

(21) Appl. No.: 12/729,034

(22) Filed: Mar. 22, 2010

(65) Prior Publication Data

US 2011/0227212 A1   Sep. 22, 2011

(51) Int. Cl.
*H01L 23/00* (2006.01)
*H01L 21/50* (2006.01)

(52) U.S. Cl. ......... 257/724; 257/E23.001; 257/E21.499; 257/686; 257/685; 257/777; 257/723; 257/531; 257/528; 257/778; 257/734; 257/737; 257/738

(58) Field of Classification Search ............. 257/724, 257/E21.499, E23.001, 686, 685, 777, 723, 257/531, 528, 728, 778, 734, 737, 738
See application file for complete search history.

(56) References Cited

U.S. PATENT DOCUMENTS

| | | | | |
|---|---|---|---|---|
| 7,279,789 | B2 * | 10/2007 | Cheng | 257/713 |
| 2002/0086459 | A1 * | 7/2002 | Nakajima | 438/106 |
| 2003/0047798 | A1 * | 3/2003 | Halahan | 257/685 |
| 2004/0188818 | A1 * | 9/2004 | Wang | 257/685 |
| 2005/0017336 | A1 * | 1/2005 | Kung et al. | 257/685 |
| 2008/0142940 | A1 * | 6/2008 | Dunne | 257/686 |
| 2009/0057919 | A1 * | 3/2009 | Lin et al. | 257/777 |
| 2009/0309204 | A1 * | 12/2009 | Ha | 257/686 |
| 2010/0244208 | A1 * | 9/2010 | Pagaila et al. | 257/659 |
| 2010/0320583 | A1 * | 12/2010 | Camacho et al. | 257/686 |
| 2011/0024890 | A1 * | 2/2011 | Yang et al. | 257/686 |
| 2011/0156243 | A1 * | 6/2011 | Chang et al. | 257/702 |
| 2011/0278741 | A1 * | 11/2011 | Chua et al. | 257/777 |

* cited by examiner

*Primary Examiner* — A O Williams
(74) *Attorney, Agent, or Firm* — Muncy, Geissler, Olds & Lowe, PLLC

(57) ABSTRACT

A first substrate has a first surface facing a second surface of the second substrate. The active chips are disposed on and electrically connected to the first surface, and spaced apart from each other by an interval, wherein the active chips respectively have a first active surface. The bridge chip is mechanically and electrically connected to the second surface, and has a second active surface partially overlapped with the first active surfaces of the active chips, such that the bridge chip is used for providing a proximity communication between the active chips. The connection structure is disposed between the first surface and the second surface for combining the first substrate and the second substrate.

15 Claims, 4 Drawing Sheets

SEMICONDUCTOR DEVICE PACKAGE

BACKGROUND OF THE INVENTION

1. Field of the Invention

The invention relates in general to a device package, and more particularly to a semiconductor device package.

2. Description of the Related Art

At present, semiconductor industry has being developing and satisfying the requirement of the market. The structure of any semiconductor device demands precision and miniaturization when it comes to functionality of the semiconductor device. However, under some circumstances, the yield and quality of the semiconductor device is still difficult to control.

For example, integrated circuits (IC) packages have become more compact and require increased functions to be incorporated together. The increased logic functions on an IC package means an increase in circuit density of the IC package. As circuit density increases on the IC package, it becomes important to provide a reliable and robust packaging for forming the IC package. Also, the mechanical and electrical properties of such IC package need to be carefully considered without affecting the overall performance of the IC package.

Typically, the structure of any IC package or other semiconductor device package may be damaged due to, for example, cracks in the chips of the package when the chips are subjected to stress in the assembly process for the chips may be stressed when being directly moved by the suction nozzle to be coupled to other components.

Additionally, after assembling the chips, the structure of the IC package may be weakened due to invisible flaws on the chips and hence renders the IC package more susceptible to damages. Besides, damages on the chips adversely affect the integrity of the IC package, failing the test of the IC package. It is therefore desirable to provide a solution to address at least one of the foregoing problems of the conventional operations.

SUMMARY OF THE INVENTION

It is therefore an object of the invention to provide a semiconductor device package and its fabricating method which avoid direct handling to the chips of the semiconductor device package, preventing the damage to the chips because of fragility and improving the yield of the semiconductor device package.

The invention achieves the above-identified object by providing a semiconductor device package. The semiconductor device package includes a first substrate, a second substrate, two active chips, a bridge chip and a connection structure. The first substrate has a first surface facing a second surface of the second substrate. The active chips are disposed on and electrically connected to the first surface, and spaced apart from each other by an interval, wherein the active chips respectively have a first active surface. The bridge chip is mechanically and electrically connected to the second surface, and has a second active surface partially overlapped with the first active surfaces of the active chips, such that the bridge chip is used for providing a proximity communication between the active chips. The connection structure is disposed between the first surface and the second surface for combining the first substrate and the second substrate.

The invention achieves the above-identified object by providing a method of fabricating a semiconductor device package. The method includes the following steps: disposing and electrically connecting two active chips to a first surface of a first substrate; mechanically and electrically connecting a bridge chip to a second surface of a second substrate; aligning the first surface with the second surface, the bridge chip in accordance with an interval of the active chips; and, combining the first substrate and the second substrate by a connection structure.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1:
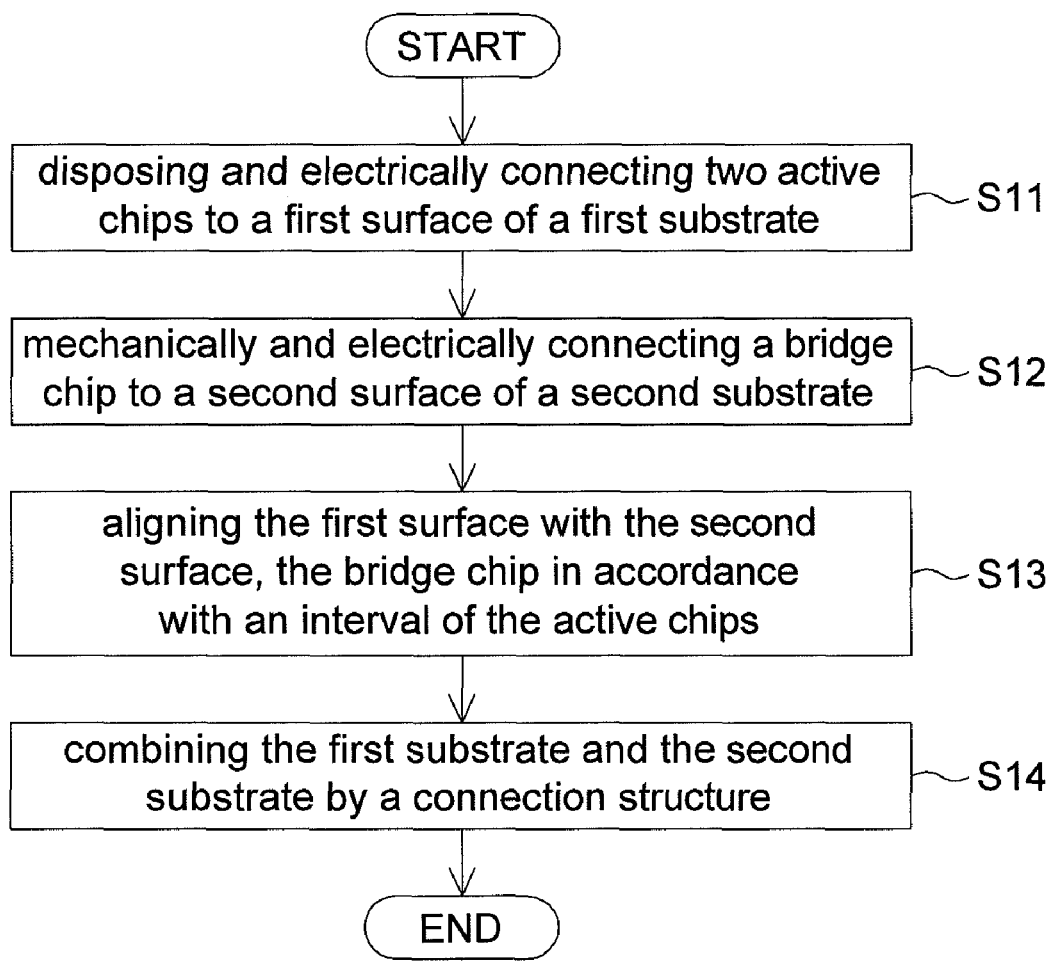
FIG. 1 shows a flowchart of a method of fabricating a semiconductor device package according to a preferred embodiment of the invention.
Figure 2A:
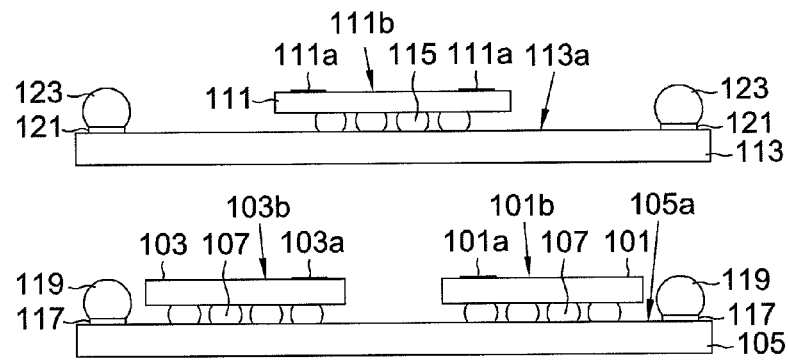
FIGS. 2A~2C show a semiconductor device package according to the preferred embodiment of the invention.
Figure 2B:
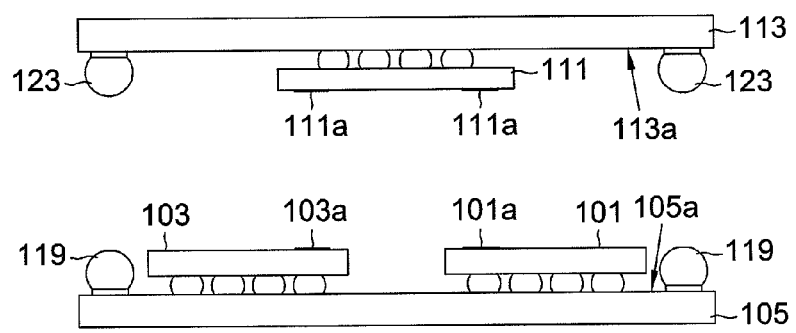
Figure 2C:
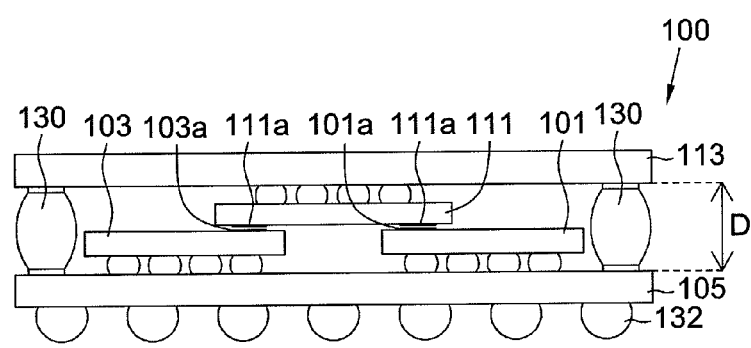

FIG. 1 shows a flowchart of a method of fabricating a semiconductor device package according to a preferred embodiment of the invention. The method includes steps S10~S14. FIGS. 2A~2C show a semiconductor device package according to the preferred embodiment of the invention.

As shown in step S11 and FIG. 2A, two active chips 101 and 103 are disposed and electrically connected to a first surface 105a of a first substrate 105. The active chip 101 has a plurality of first signal pads 101a formed on its first active surface 101b. The active chip 103 has a plurality of first signal pads 103a formed on its first active surface 103b. The active chips 101 and 103 are spaced apart from each other by an interval, and their backsides are electrically connected to the first surface 105a by a plurality of metal bumps 107, for example.

Then, as shown in step S12 and FIG. 2A, a bridge chip 111 is mechanically and electrically connected to a second surface 113a of a second substrate 113. The bridge chip 111 has a plurality of second signal pads 111a formed on its second active surface 111b, and the backside of the bridge chip 111 is electrically connected to the second surface 113a by a plurality of metal bumps 115.

For combining the first substrate 105 with the second substrate 113, a connection structure can be used and preferably supplied on the first substrate 105 and the second structure 113. As shown in FIG. 2A, the first substrate 105 has a plurality of first contact pads 117 disposed on the first surface 105a. A plurality of first solder balls 119, which are used as a part of the connection structure, are formed on the first contact pads 117. Likewise, the second substrate 113 has a plurality of second contact pads 121 disposed on the second surface 113a. A plurality of second solder balls 123, which are also used as a part of the connection structure, are formed on the second contact pads 121. Preferably, the first solder balls 119 are disposed around the active chips 101 and 103, and the second solder balls 123 are disposed around the bridge chip 111 and in accordance with the first solder balls 119.

After that, as shown in step S13 and FIG. 2B, the second substrate 113 is turned upside down, such that the first surface 105a is aligned with the second surface 113a, the bridge chip 111 in accordance with the interval of the active chips 101 and 103. Besides, the first solder balls 119 are positioned corresponding to the second solder balls 123.

Then, as shown in step S14, the first substrate 105 and the second substrate 113 are combined by a connection structure. In this step, as the first solder balls 119 and the second solder balls 123 are in contact with each other, a reflow process is applied to the whole structure, such that the metal material of the first solder balls 119 and the second solder balls 123 is melted. After the reflow step, the metal material is cooled down such that the first solder balls 119 and the second solder balls 123 are integrated to form a plurality of solder balls 130 of the connection structure as shown in FIG. 2C, and the first substrate 105 and the second substrate 113 are therefore combined to form a semiconductor device package 100.

In the semiconductor device package 100, the distance D between the first substrate 105 and the second substrate 113 is precisely controlled such that the first signal pads 101a and 103a are spaced apart from the second signal pads 111a but the first signal pads 101a and 103a and the second signal pads 111a are in proximity connection, which renders the second signal pads 111a of the bridge chip 111 to be capacitively or inductively coupled to the first signal pads 101a and 103a of the active chips 101 and 103. As the active chips 101 and 103 and the bridge chip 111 are sealed between the first substrate 105 and the second substrate 113, the electrical connection of the chips 101, 103 and 111 to external components such as semiconductor devices, circuit boards or controllers (drivers) can be accomplished by a plurality of solder balls 132 disposed on and electrically connected to the backside surface of the first substrate 105 or the second substrate 113. The connection structure for combining the first substrate 105 and the second structure 113 is consisted of the solder balls 130 however the invention is not limited thereto.

Figure 3A:
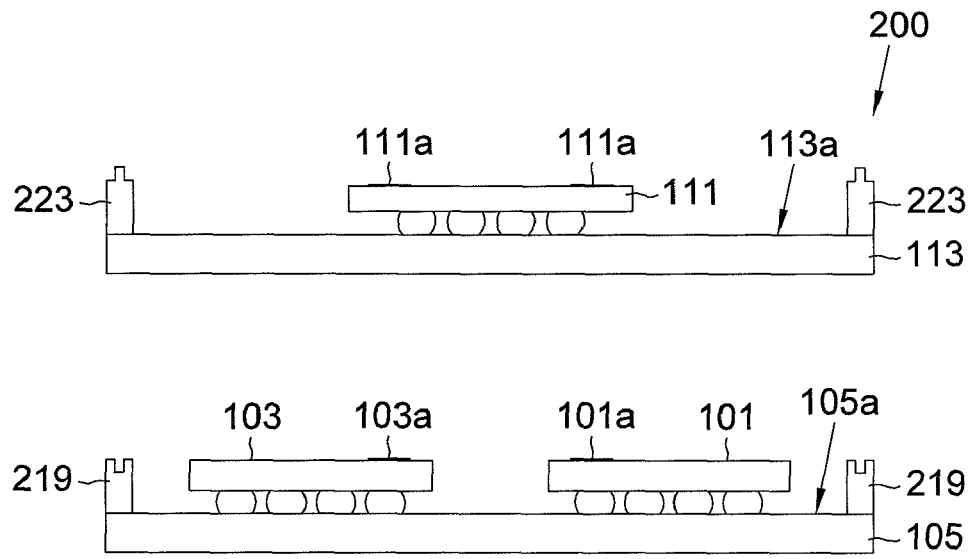
FIGS. 3A~3B show a semiconductor device package according to another preferred embodiment of the invention.
Figure 3B:
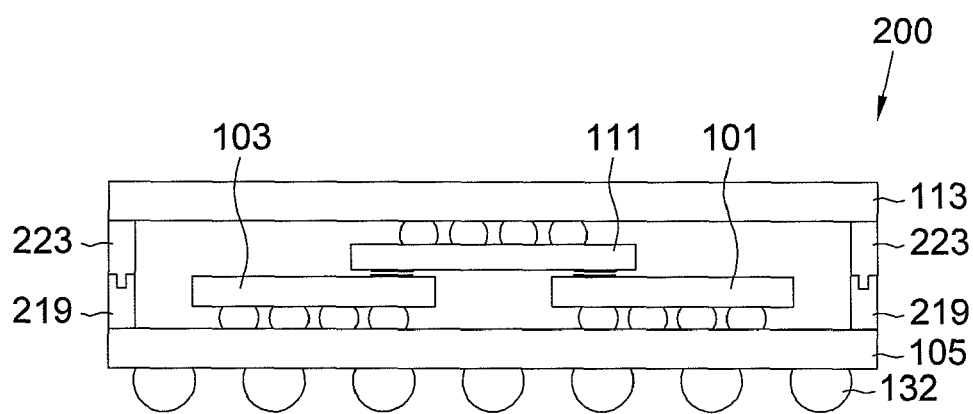

FIGS. 3A~3B show a semiconductor device package according to another preferred embodiment of the invention. The semiconductor device package 200 is different from the semiconductor device package 100 in the connection structure, so the same elements are assigned with the same reference numbers and not elaborated again.

The active chips 101 and 103 and the bridge chip 111 are respectively formed on the first substrate 105 and the second substrate 113 before combining the first substrate 105 with the second substrate 113. Beside, a plurality of first connectors 219 are formed on the first surface 105a and around the active chips 101 and 103. A plurality of second connectors 223 are formed on the second surface 113a and positioned in accordance with the first connectors 219. The first connectors 219 and the second connectors 223 are respectively female connectors and male connectors, such that the first connectors 219 and the second connectors 223 can be coupled to each other.

Likewise, the second substrate 113 is turned upside down, such that the first surface 105a is aligned with the second surface 113a, the bridge chip 111 is in accordance with the interval of the active chips 101 and 103, and the first connectors 219 are positioned corresponding to the second connectors 223. Then, as shown in FIG. 3B, the first substrate 105 and the second substrate 113 are combined by the connection structure consisting of the first connectors 219 and the second connectors 223 attached to the first connectors 219. Moreover, a plurality of solder balls 132 can be disposed on and electrically connected to the backside surface of the first substrate 105 or the second substrate 113 for electrically connecting the chips 101, 103 and 111 to external components such as semiconductor devices, circuit boards or controllers (drivers).

Figure 4A:
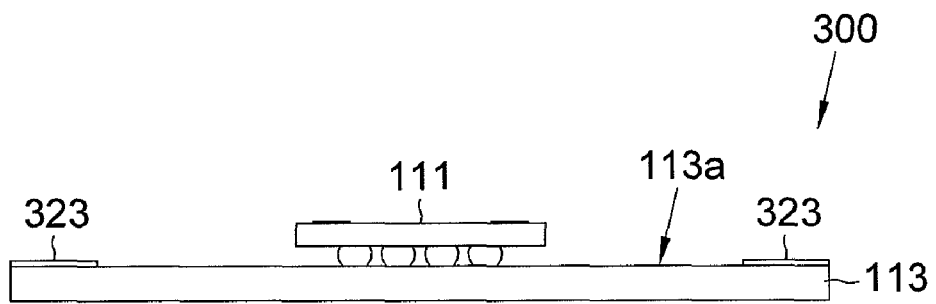
FIGS. 4A~4B show a semiconductor device package according to yet another preferred embodiment of the invention.
Figure 4A:
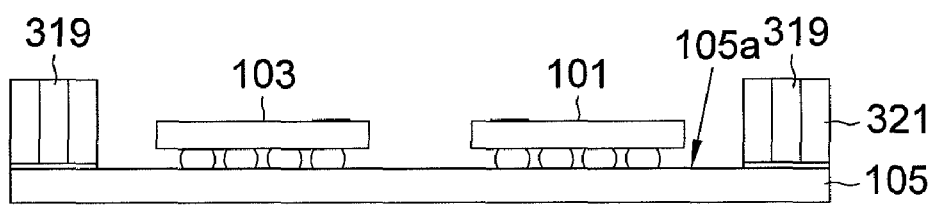
Figure 4B:
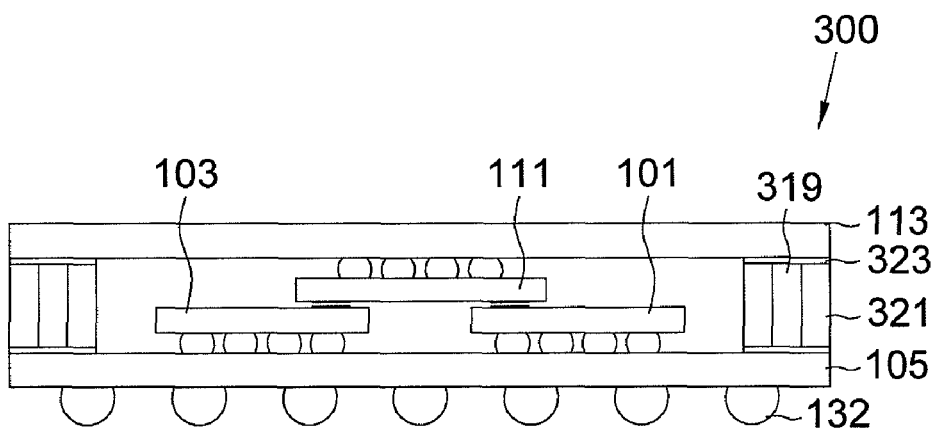

FIGS. 4A~4B show a semiconductor device package according to yet another preferred embodiment of the invention. The semiconductor device package 300 is different from the semiconductor device package 100 in the connection structure, so the same elements are assigned with the same reference numbers and not elaborated again.

As shown in FIG. 4A, a plurality of passive components 319 are mechanically and electrically connected to the first surface 105a of the first substrate 105 at locations around the active chips 101 and 103. The passive components 319 can be capacitors, resistors or inductors. Furthermore, a solder material 321 is disposed around each of the passive components 319. In accordance with the passive components 319, a plurality of contact pads 323 are formed on the second surface 113a of the second substrate 113. When combining the first substrate 105 and the second substrate 113, the second substrate 113 is firstly turned upside down such that the second surface 113a is opposite to the first surface 105a, the bridge chip 111 is aligned with the interval of the active chips 101 and 103.

Then, at least the first substrate 105 or the second substrate 113 is moved until the passive components 319 and the solder material 321 are in contact with the contact pads 323. After that, a reflow process is applied to the whole structure so as to melt the solder material 321. As the solder material 321 is cooled down, the contact pads 323 are attached to the solder material 321 as well as the passive components 319, and the first substrate 105 is connected to the second substrate 113. For electrically connecting the chips 101, 103 and 111 to external components such as semiconductor devices, circuit boards or controllers (drivers), a plurality of solder balls 132 can be disposed on and electrically connected to the backside surface of the first substrate 105 or the second substrate 113.

In the embodiment, the combination of the first substrate 105 and the second substrate 113 includes the step of turning the second substrate 113 upside down however the invention is not limited thereto. It can also be the first substrate 105 to be flipped in the fabricating process.

The semiconductor device package and the method of fabricating the semiconductor device package according to the preferred embodiment of the invention are disclosed above. When fabricating the semiconductor device package, the active chips and the bridge chip are firstly formed on two separate substrates, and the components of the connection structure are also formed on the substrates around the active chips and the bridge chip. Then, one substrate having the active chips or the bridge chip is reversed to face and be combined with the other substrate via the connection structure. After the substrates are combined together, accordingly, the assembly, positioning and electrical connection of the active chips and the bridge chip are completed without employing additional tools to directly catch the active chips and the bridge chip during the fabricating process. Thus, compared to the conventional method of fabricating a semiconductor device package using a suction nozzle to catch and move the chips when assembling the chips, the semiconductor device package and the method of fabricating the semiconductor device package according to the preferred embodiment of the invention avoid the direct handling to the chips, thus prevent the problem of damaging the chips due to the fragility of the chips.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor device package, comprising:
a first substrate having a first surface;
a second substrate having a second surface facing the first surface;
two active chips disposed on and electrically connected to the first surface, wherein the active chips are spaced apart from each other by an interval, and the active chips respectively have a first active surface;
a bridge chip mechanically and electrically connected to the second surface, wherein the bridge chip has a second active surface, the second active surface is partially overlapped with the first active surfaces of the active chips, the bridge chip is used for providing a proximity communication between the active chips; and
a connection structure disposed between the first surface and the second surface for combining the first substrate and the second substrate, wherein the connection structure comprises a plurality of passive components.

2. The semiconductor device package according to claim 1, wherein:
each of the active chips has a plurality of first signal pads formed on the first active surface;
the bridge chip has a plurality of second signal pads formed on the second active surface;
at least some of the second signal pads of the bridge chip are capacitively or inductively coupled to at least some of the first signal pads of the active chips.

3. The semiconductor device package according to claim 1, further comprising a plurality of metal bumps connecting to the active chips and the first surface.

4. The semiconductor device package according to claim 1, further comprising a plurality of metal bumps connecting to the bridge chip and the second surface.

5. The semiconductor device package according to claim 1, wherein the connection structure is disposed around the active chips and the bridge chip.

6. The semiconductor device package according to claim 1, wherein the connection structure comprises a plurality of solder balls.

7. The semiconductor device package according to claim 1, wherein the connection structure comprises at least two male connectors and at least two female connectors coupled to each other.

8. The semiconductor device package according to claim 7, wherein the female connectors are disposed on the first substrate, the male connectors are disposed on the second substrate.

9. The semiconductor device package according to claim 1, wherein the passive components are capacitors, resistors or inductors.

10. The semiconductor device package according to claim 1, further comprising a plurality of solder balls disposed on a third surface of the first substrate opposite to the first surface.

11. A semiconductor device package, comprising:
a first substrate having a first surface;
a second substrate having a second surface facing the first surface;
two active chips disposed on and electrically connected to the first surface, wherein the active chips are spaced apart from each other by an interval, and the active chips respectively have a first active surface;
a bridge chip mechanically and electrically connected to the second surface, wherein the bridge chip has a second active surface, the second active surface is partially overlapped with the first active surfaces of the active chips, the bridge chip is used for providing a proximity communication between the active chips;
a plurality of passive components mechanically and electrically connected to the first surface of the first substrate; and
a solder material disposed around each of the passive components.

12. The semiconductor device package according to claim 11, further comprising a plurality of contact pads on the second surface of the second substrate, wherein the passive components and the solder material are in contact with the contact pads.

13. The semiconductor device package according to claim 11, wherein:
each of the active chips has a plurality of first signal pads formed on the first active surface;
the bridge chip has a plurality of second signal pads formed on the second active surface;
at least some of the second signal pads of the bridge chip are capacitively or inductively coupled to at least some of the first signal pads of the active chips.

14. The semiconductor device package according to claim 11, further comprising a plurality of metal bumps connecting to the active chips and the first surface.

15. The semiconductor device package according to claim 11, further comprising a plurality of metal bumps connecting to the bridge chip and the second surface.

* * * * *